United States Patent
Brown et al.

(10) Patent No.: US 6,824,390 B2
(45) Date of Patent: Nov. 30, 2004

(54) METHOD AND ARRANGEMENT FOR REPLACING A BOARD-MOUNTED ELECTRIC CIRCUIT COMPONENT

(75) Inventors: Robert V. Brown, Leo, IN (US); Robert D. Dannenberg, Defiance, OH (US)

(73) Assignee: International Truck Intellectual Property Company, LLC, Warrenville, IL (US)

( * ) Notice: Subject to any disclaimer, the term of this patent is extended or adjusted under 35 U.S.C. 154(b) by 0 days.

(21) Appl. No.: 10/306,014

(22) Filed: Nov. 27, 2002

(65) Prior Publication Data

US 2003/0183417 A1 Oct. 2, 2003

Related U.S. Application Data

(62) Division of application No. 10/113,410, filed on Apr. 1, 2002, now Pat. No. 6,729,020.

(51) Int. Cl.[7] .................................................. H01R 9/09
(52) U.S. Cl. .......................................... 439/57; 439/516
(58) Field of Search ........................... 439/56, 57, 168, 439/547, 516

(56) References Cited

U.S. PATENT DOCUMENTS 5,702,254 A * 12/1997 Whitson et al. ............... 439/57

* cited by examiner

*Primary Examiner*—Neil Abrams
(74) *Attorney, Agent, or Firm*—Jeffrey P. Calfa; Dennis Kelly Sullivan; Susan L. Lukasik

(57) ABSTRACT

An instrument panel of an automotive vehicle has an original circuit board (10). An LED (16) is disposed on a bridge (34) in the board and faces a driver of the vehicle. Two terminals (16T1, 16T2) extend through the bridge to conductive continuity with respective conductive traces (24, 26) on the rear board face 12. Should the LED fail, it is replaced by severing the bridge from the board and removing it along with the LED on it. The severing creates a through-hole (36) in the board. A socket (40) that contains a replacement LED (16R) is installed in the through-hole and provides conductive continuity of the respective traces on the board with respective terminals of the replacement LED.

3 Claims, 2 Drawing Sheets

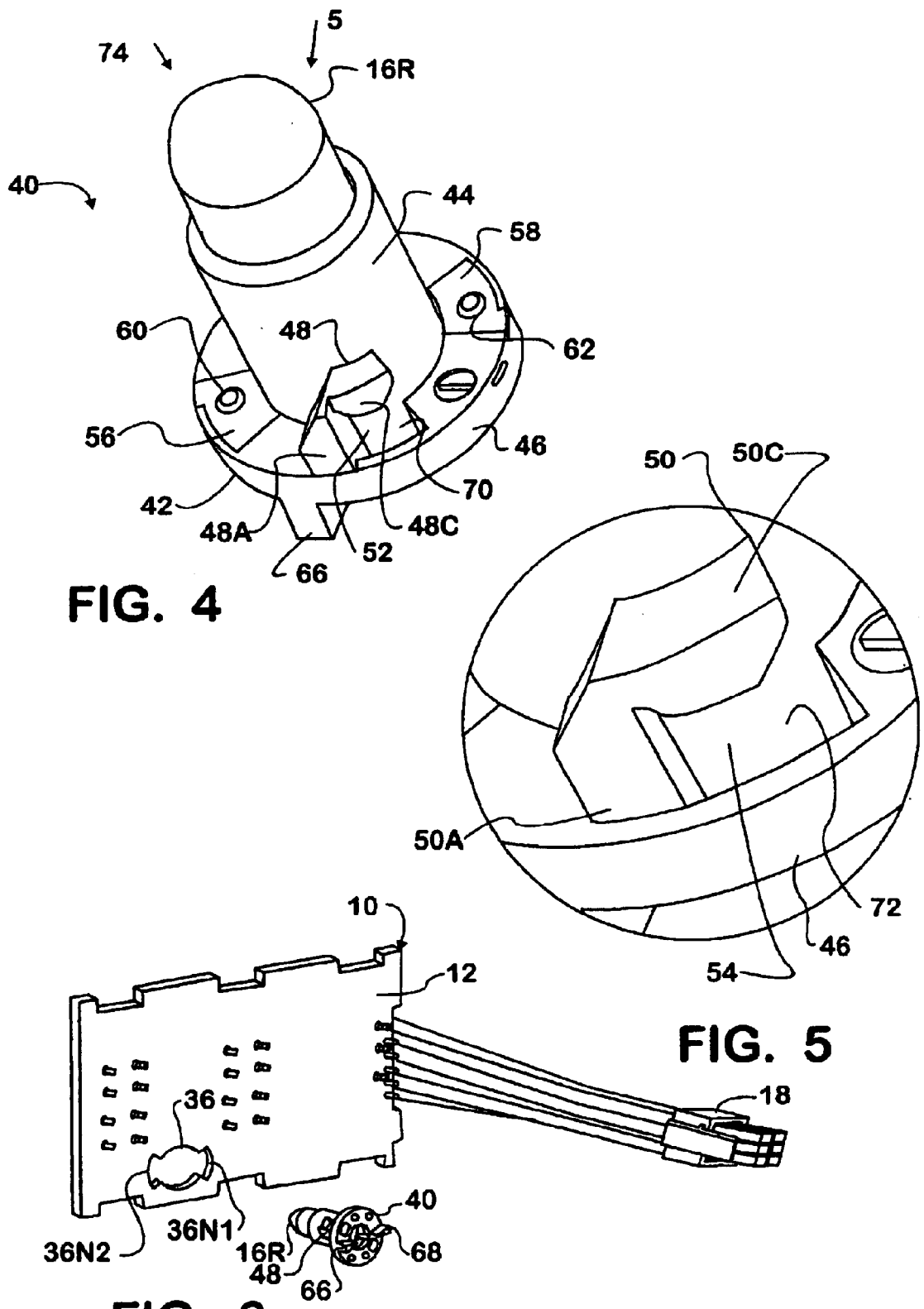

METHOD AND ARRANGEMENT FOR REPLACING A BOARD-MOUNTED ELECTRIC CIRCUIT COMPONENT

This is a division of application Ser. No. 10/113,410, filed Apr. 1, 2002 now U.S. Pat. No. 6,729,020.

FIELD OF THE INVENTION

This invention relates to the replacement of circuit components on electric circuit boards, such as replacement of an LED (light emitting diode) on a circuit board that is used in an instrument panel of an automotive vehicle.

BACKGROUND AND SUMMARY OF THE INVENTION

An instrument panel of an automotive vehicle contains instrumentation and/or displays for presenting information about various operating conditions to the driver. One manner of displaying certain information is by the illumination of devices such as indicator lamps. Certain instrument panels comprise circuit boards on which indicator lamps are mounted. One type of electric device that is used as an indicator lamp is an LED (light emitting diode).

A cost-efficient way to fabricate an instrument panel circuit board involves the use of automated equipment that automatically assembles circuit components to a printed circuit board. The board has a front face on which bodies of the circuit components are disposed. The circuit components have terminals in the form of leads that extend from their bodies through pre-existing holes in the board. The process of automatically inserting the components into the board in that manner is sometimes referred to as stuffing a board.

The board has a rear face containing patterns of circuit traces that are laid out to establish desired electric circuits containing the circuit components. The circuit trace patterns are created by the selective removal of portions of a conductive layer on the rear face of the board during the process of fabricating the board prior to stuffing. After being stuffed, the board is processed by a wave-soldering machine that solders the respective terminals of the various components to the respective circuit traces.

An LED may be assembled directly to a circuit board in this way.

While LED's generally have excellent reliability, one may occasionally fail. Where a failed LED has been directly assembled to a circuit board in the manner just described, its removal and replacement by a new LED may require considerably more effort than if the failed LED had been mounted in the first instance in a socket that would enable it to be simply extracted from the socket and replaced. Unsoldering and soldering a direct-mounted circuit component involve the use of concentrated heat at a sufficiently high temperature to melt solder. Care must be exercised in unsoldering a failed component, removing it from the board, assembling a new replacement component to the board, and finally soldering the replacement component in place. Lack of care has the potential to damage the replacement component, other board components, and/or the circuit board.

The use of sockets in the original manufacture of a board for enabling components inserted into them to be more easily replaced poses certain potential disadvantages. Because space on a circuit board is often limited, components are mounted in close proximity to one another, and consequently the use of sockets for allowing circuit components to be inserted and removed without unsoldering and re-soldering increases not only the size of a particular circuit board but also its initial cost. In light of the generally high reliability of LED's, the inclusion of sockets for mounting them on a board to facilitate their replacement in event of failure is apt to impose a cost penalty on many circuit boards that would never experience a failed circuit component, and hence that does not seem to present a cost-efficient solution for facilitating replacement of the few that may fail.

One aspect of the present invention relates to a method for replacement of a direct-soldered circuit component that is believed to provide a better alternative both to unsoldering the failed component from the board and re-soldering a new one and to use of sockets in original board manufacture. The invention allows circuit boards to continue to be manufactured by cost-efficient methods involving direct soldering of components to the boards, yet allows a failed component to be replaced without unsoldering it from the board and then re-soldering a replacement component in its place.

While certain principles of the invention are specific to replacement of failed LED's, principles may be applied to replacement of components other than LED's. The invention is especially advantageous for replacement of components that are polarity-sensitive.

Being a two-terminal, polarity-sensitive component, an LED will illuminate only when sufficient voltage is applied with proper polarity across its terminals. While traces that feed an LED on a circuit board are designed to deliver the proper polarity when an LED is correctly connected, a replacement whose connections to the board traces are reversed will never illuminate when intended. The present invention offers the opportunity to avoid such an occurrence because it includes a polarizing feature.

One aspect of the present invention relates to a method for replacing an original board-mounted electric circuit component having plural terminals, each of which has conductive continuity with a respective conductive trace on the board, by a replacement component. A template feature is incorporated proximate the component and defines at least a portion of a zone from which board material is to be removed to enable the board to accept a replacement component having terminals corresponding to those of the original component. The board is modified by removing both the board-mounted component from the board and board material from the zone using the template feature. The replacement component is mounted on the board at the zone so as to establish conductive continuity of the respective traces on the board with respective terminals of the replacement component.

Another aspect of the present invention relates to a method for replacing an original board-mounted electric circuit component having plural terminals, each of which has conductive continuity with a respective conductive trace on the board, by a replacement component. A portion of the board that includes the board-mounted component is removed to create a through-hole in the board in place of the original component. The replacement component is mounted on the board by disposing, in the through-hole, a socket that has a receptacle for receiving the replacement component and providing conductive continuity of the respective traces on the board with respective terminals of the replacement component.

Still another aspect of the invention relates to a method for replacing an original board-mounted LED having a body disposed on a front face of the board and two terminals, each of which extends from the body through a respective through-hole in the board to attain conductive continuity with a respective conductive trace on a rear face of the board. The board is provided with plural through-openings that are separated by a bridge on which the original LED is disposed. The bridge, including the original LED, is removed from the board to create a socket-receiving through-hole in the board. A socket having a receptacle for receiving a replacement LED and providing conductive continuity of the respective traces on the board with respective terminals of the replacement LED is installed in the socket-receiving through-hole. A replacement LED is mounted in the socket.

Still another aspect of the invention relates to a method for replacing an original board-mounted LED in an instrument panel of an automotive vehicle. The LED comprises a body disposed on a front face of the board to face a driver of the vehicle and two terminals, each of which extends from the body through a respective through-hole in a bridge in the board on which the LED is disposed to attain conductive continuity with a respective conductive trace on a rear face of the board. The board also comprises plural through-openings that are separated by the bridge. First the board is accessed to enable the original LED to be replaced. The bridge, including the original LED, is removed from the board to create a socket-receiving through-hole in the board. A socket for mounting a replacement LED and providing conductive continuity of the respective traces on the board with respective terminals of a replacement LED is disposed in the socket-receiving through-hole, and the replacement LED is mounted in the socket.

Still another aspect of the invention relates to a circuit board comprising an original LED having a body disposed on a front face of the board and two terminals, each of which extends from the body through a respective through-hole in the board to attain conductive continuity with a respective conductive trace on a rear face of the board at a respective solder joint. The board has plural through-openings that are separated by a bridge on which the original LED is disposed. One segment of one trace extends along one approach of the bridge to one of the through-holes, and one segment of another trace extends along another approach of the bridge to the other through-hole. The one trace comprises another segment running along a margin of one of the through-openings, and the other trace comprises another segment running along a margin of another of the through-openings.

The foregoing, along with further aspects, features, and advantages of the invention, will be seen in the following disclosure of a presently preferred embodiment of the invention depicting the best mode contemplated at this time for carrying out the invention. The disclosure includes drawings, briefly described as follows.

BRIEF DESCRIPTION OF THE DRAWINGS

FIG. 4 is a front perspective view of a replacement LED mounted in a socket.

FIG. 5 is an enlarged fragmentary perspective view in the direction of arrow 5 in FIG. 4.

FIG. 6 is a rear perspective view illustrating how the socket-mounted replacement LED mounts on the board.

DESCRIPTION OF THE PREFERRED EMBODIMENT

Figure 1:
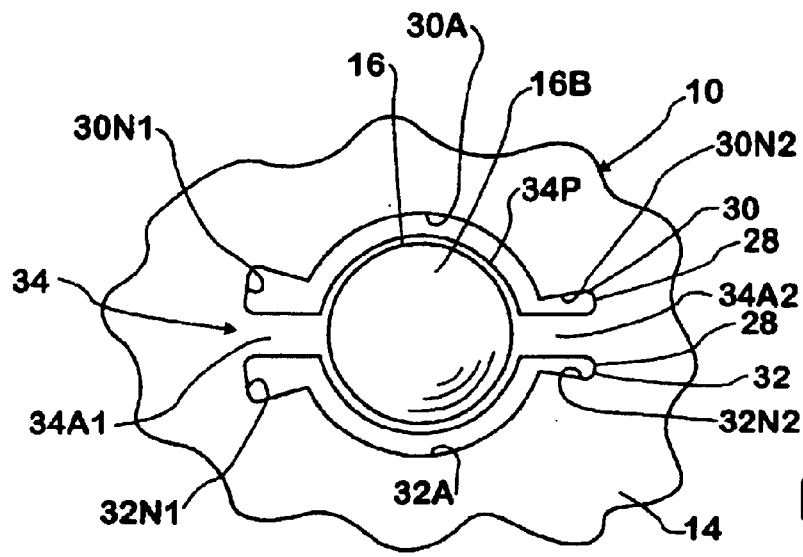
FIG. 1 is front view of a portion of a circuit board containing an original LED.

FIG. 1 shows a portion of a front face of a circuit board 10 of an instrument panel of an automotive vehicle. Circuit board 10 is disposed behind an instrumentation display (not shown) that faces the driver of the vehicle for presenting information about various conditions associated with operation of the vehicle. Information may be presented in various ways. One way is by movements of electromechanical gauges. Another way is by illuminating electric devices such as lamps or LED's.

Figure 2:
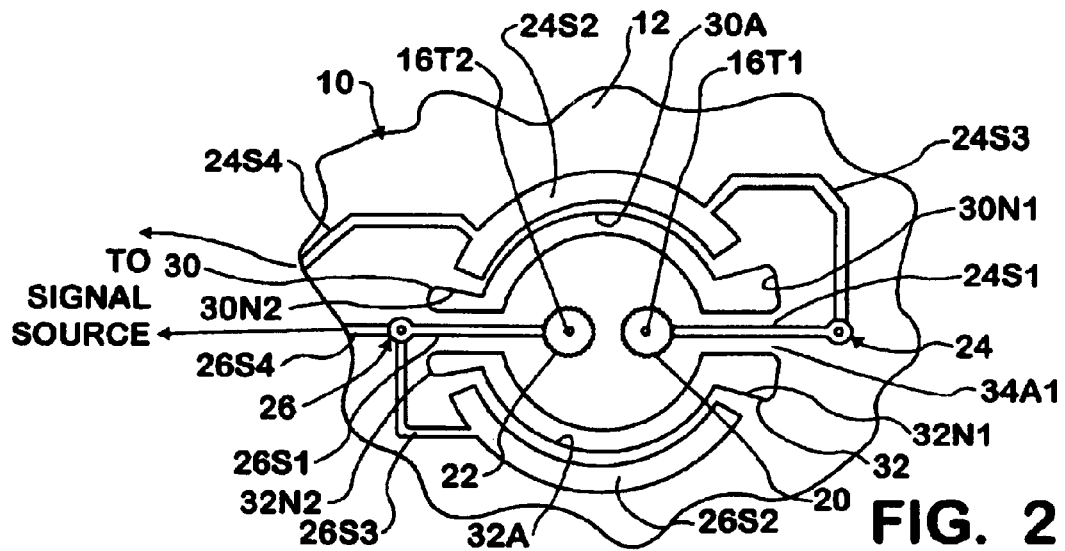
FIG. 2 is a rear view of FIG. 1.

The full view in FIG. 6 shows circuit board 10 as a flat board and having a generally uniform thickness. Board 10 is relatively rigid and comprises a rear face 12 and a front face 14, the latter face being marked as such in FIG. 1, and is fabricated in accordance with known methods using known materials. Various electric circuit components are disposed on front face 14 and have terminals in the form of wire leads that extend through holes in the board to rear face 12 where they are soldered to respective circuit traces that are laid out on rear face 12 to establish desired electric circuits. FIGS. 1 and 2 show an LED 16 assembled directly to circuit board 10 in this way. The board traces are connected with wiring in the vehicle in any suitable manner, for example by an electric connector 18 at an end of a pigtail as in FIG. 6, thereby coupling the instrumentation with other elements of the vehicle electrical system that are remote from board 10.

As shown by FIGS. 1 and 2, LED 16 comprises a body 16B and two terminals 16T1, 16T2. When proper polarity voltage of sufficient magnitude is applied across terminals 16T1, 16T2, light that can be viewed by the driver is emitted from body 16B. Body 16B is disposed on front face 14 and terminals 16T1, 16T2 extend rearward from body 16B through respective holes in board 10 to rear face 12 where respective solder joints 20, 22 secure the terminals to respective traces 24, 26 on board 10.

The portions of traces 24, 26 proximate LED 16 are arranged in a pattern that provides for replacement of LED 16 in accordance with principles of the invention and that mutually correlates with a feature incorporated in board 10 proximate LED 16 to facilitate practice of the invention. In the example illustrated, that feature is a template 28 that is incorporated in board 10 in any suitable form to define at least a portion of a zone from which board material is to be removed to enable the board to accept a replacement component. The particular template 28 shown in FIG. 1 and 2 comprises two through-openings 30, 32 disposed respectively in opposite semi-circumferences of the board material surrounding LED 16. Each through-opening is essentially the mirror image of the other about an imaginary line between terminals 16T1 and 16T2 that is coincident with a diameter of LED body 16B.

Through-opening 30 has a shape that comprises an arc 30A having slightly less than a full semi-circumferential extent and notches 30N1, 30N2 that extend radially outward from opposite ends of arc 30A. Likewise, through-opening 32 has a shape that comprises an arc 32A having slightly less than a full semi-circumferential extent and notches 32N1, 32N2 that extend generally radially outward from opposite ends of arc 32A.

The shapes of the through-openings provide board 10 with a bridge 34 of board material on which LED 16 and portions of respective segments 24S1 and 26S1 of respective traces 24 and 26 leading from solder joints 20, 22 are disposed. At its center, bridge 34 provides a circular platform 34P for LED 16. The through-holes in board 10 through which terminals 16T1, 16T2 pass from body 16B to solder joints 20 and 22 are disposed in platform 34P. Bridge 34 includes approaches 34A1, 34A2 to platform 34P, and a portion of each trace segment 24S1, 26S1 runs along the centerline of the respective approach.

Traces 24, 26 ultimately extend on board 10 to a signal source (not shown) that can provide voltage for illuminating LED 16 to enable LED to function as an indicator, either alone, or in combination with other circuit components on board 10. The signal source may be either on, or remote from, the board. The present example discloses that each trace 24, 26 has a different pattern through which it provides conductive continuity from LED 16 to the signal source. The patterns do however share certain common attributes.

One common attribute is that each trace 24, 26 comprises a respective segment 24S2, 26S2 in the shape of an arcuate band of generally uniform width that runs along the radially outer margin of the arc 30A, 32A of the respective through-opening 30, 32. Each segment 24S2, 26S2 and the respective arc are concentric both mutually and with platform 34P and LED 16. Opposite ends of each trace segment 24S2, 26S2 stop short of the respective notches 30N1, 30N2; 32N1, 32N2.

Trace 24 is distinctive in that it has a segment 24S3 running from segment 24S1 to the end of segment 24S2 that is proximate notch 30N2, and a segment 24S4 running from the opposite end of segment 24S2 ultimately to the signal source.

Trace 26 differs from trace 24 in that it has a segment 26S3 running from segment 26S1 to the end of segment 26S2 that is proximate notch 32N2, and a segment 26S4 running from the junction of segments 26S1 and 26S3 ultimately to the signal source.

Therefore terminal 16T1 is fed through all four segments 24S1, 24S2, 24S3, 24S4 of trace 24 while terminal 16T2 is fed through only segments 26S4 and 26S1, making segment 26S3 simply a branch from segment 26S4 to segment 26S2.

Figure 3:
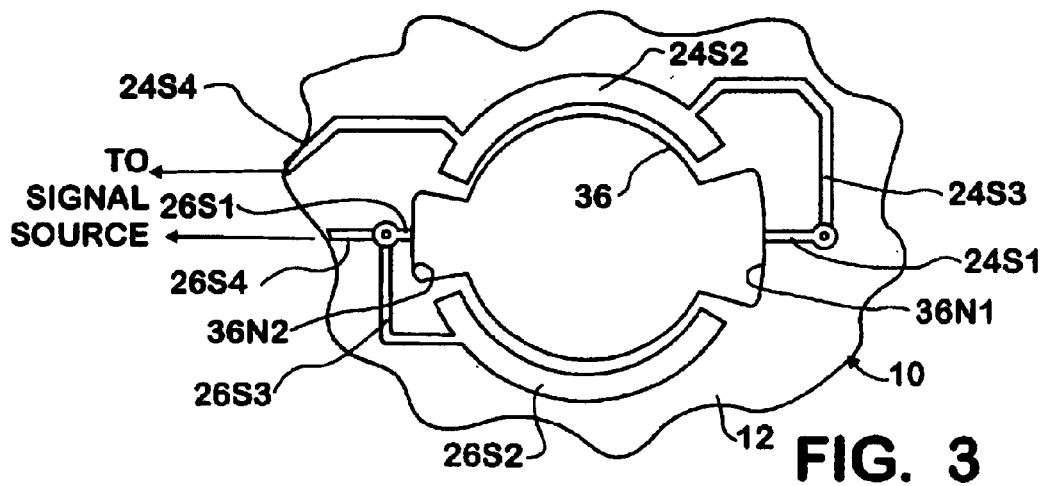
FIG. 3 is a view like FIG. 2, but with the LED and a portion of the board having been removed.

In accordance with principles of the invention, LED 16 is replaced in the following manner. Using any suitable tool, such as a small scalpel or milling tool, and using a portion of template 28 as a guide, cuts are made to sever bridge 34 in its entirely from board 10, one cut being made transversely across approach 34A1 by first inserting the tool into one of notches 30N1, 32N1, against the radially outer edge of the notch and then cutting transversely across the approach toward the radially outer edge of the other of those two notches. The other cut is made in similar fashion to sever approach 34A2 using notches 30N2, 32N2 as a template for proper tool orientation. Once both cuts have been completed, bridge 34, with LED 16 on it, is free of board 10 and can be removed. This leaves a single through-hole 36 in board 10, as shown by FIG. 3.

The perimeter margin of through-hole 36 has a polarizing feature provided by diametrically opposed notches 36N1, 36N2 that are created from respective pairs of notches 30N1, 32N1; 30N2, 32N2 once bridge 34 has been severed and removed. Although notches 36N1, 36N2 have similar shapes, they are not congruent. FIG. 3 shows that notch 36N1 has a larger circumferential extent than notch 36N2 while their radial dimensions are substantially equal. Through-hole 36 enables a socket, such as socket 40 in FIGS. 4, 5, and 6, to be installed on board 10 by hand.

Socket 40 comprises a base 42 having a cylindrical sidewall 44 and a generally circular flange 46 around the outside of sidewall 44 near one end of the sidewall. Socket 40 further comprises two locking tabs 48 and 50 that are generally diametrically opposite each other. Each locking tab has an axial portion 48A, 50A and a circumferential portion 48C, 50C. Each axial portion 48A, 50A extends in an axial direction from where it adjoins flange 46 toward the opposite end of sidewall 44. Along that extent, each axial portion adjoins sidewall 44. Each circumferential portion 48C, 50C also adjoins sidewall 44 and extends in the same circumferential sense from the respective axial portion 48A, 50A such that the two locking tabs form respective throats 52, 54 that open in the same circumferential sense. Each circumferential portion 48C, 50C is spaced axially from flange 46 a distance approximately equal to the thickness of board 10 to endow each throat 52, 54 with a dimension (as measured axially of the socket) equal to that thickness. The two locking tabs are thus generally identical in appearance, but importantly, their circumferential extents differ such that the one of longer circumferential extent, 50C, can pass through notch 36N1, but not through notch 36N2.

Socket 40 further comprises two contacts 56, 58 that are disposed on one axial face of flange 46 generally diametrically opposite each other. Each contact 56, 58 is formed to have a respective dome 60, 62 that is raised in a direction away from flange 46. Internally of socket 40, each contact 56, 58 has respective conductive continuity with a respective terminal of a replacement LED 16R, corresponding to LED 16, that has been inserted into a receptacle of socket 40 at the end of sidewall 44 opposite base 42. Disposed on the face of flange 46 opposite contacts 56, 58 and generally diametrically opposite each other, are two twist tabs 66, 68 that are used to twist socket 40 into and out of interlocking engagement with through-hole 36.

Socket 40 may be fabricated as a molded plastic part with the two locking tabs 48, 50 and the two twist tabs 66, 68 integrally formed therein. Mold pins that are used in the molding of circumferential portions 48C, 50C leave residual holes 70, 72 in flange 46. Contacts 56, 58 are fabricated from electrically conductive metal and associated with the socket in any suitable manner.

As viewed axially in the direction of arrow 74 in FIG. 5, socket 40 is constructed such that the outline of sidewall 44 and locking tabs 48, 50 matches, with appropriate slight dimensional clearance, that of through-hole 36, including notches 36N1, 36N2. By disposing socket 40 in the manner suggested by FIG. 6 with sidewall 44 aligned with the through-hole center and circumferentially oriented to the through-hole such that locking tab 50 is in circumferential registration with notch 36N1 and locking tab 48 with notch 36N2, and then advancing the socket toward the board, the socket can be passed through the through-hole until flange 46 abuts the board around the margin of the through-hole. When that happens, the circumferential portions 48C, 50C have passed through the through-hole to front face 14, and contact domes 60, 62 respectively are abutting segments 26S2 and 24S2 of respective traces 26, 24. By now twisting base 42 in the clockwise sense as viewed in FIG. 3 relative to board 10, locking tabs 48, 50 will lock onto portions of the margins of through-hole 36 such that the clockwise radial margin of each notch 36N2, 36N1 becomes lodged in the respective throat 52, 54 until no further twisting can occur due to abutment of axial portions 48A, 50A with the edges of the clockwise radial margins. As the socket is being twisted, each dome 60, 62 rides along the respective segment 26S2, 24S2 to maintain continuity of contacts 56, 58 with traces 26, 24. An alternate construction for the socket that is not specifically shown but that eliminates the metal contacts that have been shown and described, comprises forming the socket with groves in the base to allow the LED wire leads to be wrapped around the plastic base and form "built-in" contacts.

Therefore, it can be appreciated that the complementary polarizing features of socket 40 and through-hole 36 allow the socket to be inserted into the through-hole only when the respective polarizing features are in unique circumferential registry. After having been so inserted, the socket can then be circumferentially indexed, i.e. turned, a fixed distance to installed position, thereby placing LED 16R in circuit across traces 24, 26.

The conductive trace patterns on the rear of the board that enable the invention to be practiced can be incorporated in a board simply by masking in a way that will provide the desired patterns as the board is being fabricated. No additional conductive material is needed because the trace patterns are created by removal of conductive material in accordance with the mask pattern. Removal of a failed circuit element can be accomplished with a simple tool. For a component such as an LED, a replacement can be installed manually. Hence, the invention provides an efficient means for replacing a failed circuit component that is directly mounted on a circuit board while enabling the board to be fabricated with direct mounting of components so that the original manufacture incurs no, or at most a small, cost penalty.

When board 10 is functional in an instrument panel of a vehicle, and an original LED fails, the panel is opened to provide access to the board for enabling the failed component to be removed and replaced in the manner disclosed. The instrument panel is then restored to functional service.

While a presently preferred embodiment of the invention has been illustrated and described, it should be appreciated that principles of the invention are applicable to all embodiments that fall within the scope of the following claims.

What is claimed is:

1. A circuit board comprising:

a board having a front face and a rear face;

an original LED having a body disposed on the front face of the board and two terminals, each of which extends from the LED body through a respective through-hole in the board to attain conductive continuity with a respective conductive trace on the rear face at a respective joint;

the board comprising first and second through-openings separated by a bridge that comprises a platform on which the LED body is disposed and first and second approaches extending radially of a center of the platform;

each through-opening spanning a respective arc that is substantially concentric with the center of the platform;

a first of the traces comprising a first segment running along at least a portion of the margin of the arc spanned by the first through-opening and a second segment running along the first approach to one of the through-holes;

a second of the traces comprising a first segment running along at least a portion of the margin of the arc spanned by the second through-opening and a second segment running along the second approach to another of the through-holes;

each through-opening comprising notches that extend radially outward at opposite ends of the arc spanned by the respective through-opening such that the first approach is bounded by a first notch of each through-opening and the second approach is bounded by a second notch of each through-opening, wherein the first notches and the first approach collectively have a construction and arrangement that is asymmetric to that of the second notches and the second approach collectively about the center of the platform for enabling a replacement LED to be mounted in unique circumferential orientation relative to the center of the platform in a opening created by removing the bridge, including the original LED, from the circuit board and to have proper polarity connection to the respective traces.

2. A circuit board as set forth in claim 1 wherein the asymmetry is provided by the first notches and the first approach having an overall circumferential extent that is greater than that of the second notches and the second approach.

3. A circuit board as set forth in claim 2 wherein the first and second approaches extend in directly opposite radial directions.

* * * * *